(12) United States Patent
Kawazoe et al.

(10) Patent No.: US 9,212,431 B2
(45) Date of Patent: Dec. 15, 2015

(54) SILICON SINGLE CRYSTAL PULLING DEVICE AND GRAPHITE MEMBER USED THEREIN

(75) Inventors: Shinichi Kawazoe, Hiratsuka (JP);
Fukuo Ogawa, Hiratsuka (JP); Yasuhito Narushima, Hiratsuka (JP); Tsuneaki Tomonaga, Hiratsuka (JP); Toshimichi Kubota, Hiratsuka (JP)

(73) Assignee: SUMCO TECHXIV CORPORATION, Hiratsuka-Shi, Kanagawa (JP)

( * ) Notice: Subject to any disclaimer, the term of this patent is extended or adjusted under 35 U.S.C. 154(b) by 1763 days.

(21) Appl. No.: 11/863,894

(22) Filed: Sep. 28, 2007

(65) Prior Publication Data

US 2008/0078322 A1 Apr. 3, 2008

(30) Foreign Application Priority Data

Sep. 29, 2006 (JP) .................................. 2006-268028

(51) Int. Cl.
*C30B 35/00* (2006.01)
*C30B 15/00* (2006.01)
*C30B 15/14* (2006.01)
*C30B 11/00* (2006.01)
*C30B 29/06* (2006.01)

(52) U.S. Cl.
CPC ............... *C30B 15/00* (2013.01); *C30B 11/003* (2013.01); *C30B 15/14* (2013.01); *C30B 29/06* (2013.01); *C30B 35/00* (2013.01); *Y10T 117/1024* (2015.01); *Y10T 117/1032* (2015.01); *Y10T 117/1068* (2015.01)

(58) Field of Classification Search
CPC ...... C30B 15/14; C30B 35/00; C30B 11/003; Y10T 117/1068; Y10T 117/1024
USPC ......................................... 117/200, 217, 222
See application file for complete search history.

(56) References Cited

U.S. PATENT DOCUMENTS

| | | | | |
|---|---|---|---|---|
| 3,761,692 A | * | 9/1973 | Cope | 117/202 |
| 3,969,131 A | * | 7/1976 | Fatzer et al. | 378/144 |
| 4,410,796 A | * | 10/1983 | Wilsey | 117/210 |
| 4,536,442 A | * | 8/1985 | Bovenkerk et al. | 428/323 |
| 4,549,345 A | * | 10/1985 | Wilsey | 29/611 |
| 6,083,625 A | * | 7/2000 | Fiel et al. | 428/408 |
| 6,285,011 B1 | * | 9/2001 | Cherko | 219/426 |
| 2002/0096109 A1 | * | 7/2002 | Lee et al. | 117/208 |
| 2003/0148104 A1 | * | 8/2003 | Kahl et al. | 428/408 |
| 2004/0109748 A1 | * | 6/2004 | Joe et al. | 414/416.01 |

FOREIGN PATENT DOCUMENTS

JP 01-142463 9/1989
JP 02296788 A * 12/1990 ............. C30B 15/14
(Continued)

OTHER PUBLICATIONS

Office Action from corresponding Japanese Application No. 2006-268028 dated Feb. 22, 2011.

*Primary Examiner* — Matthew Song
(74) *Attorney, Agent, or Firm* — Alston & Bird LLP (57) ABSTRACT

A graphite member utilized in a pulling device for pulling a silicon single crystal is provided. An edge part of the graphite member is rounded off which is exposed to a reactive gas. The graphite member may comprise: a plate part having a thickness of 't' wherein a curvature radius of 'r' satisfies the formula: $t/8 \leq r \leq t/4$.

8 Claims, 6 Drawing Sheets

(56) References Cited

FOREIGN PATENT DOCUMENTS

| JP | 4-106367 | 9/1992 |
|---|---|---|
| JP | 04-106367 | 9/1992 |
| JP | 06-042968 | 6/1994 |
| JP | A-2000-290094 | 10/2000 |
| JP | A-2000-319080 | 11/2000 |
| JP | A-2000-351670 | 12/2000 |
| JP | 2001-010889 | 1/2001 |
| JP | 2008-087973 | 4/2008 |

\* cited by examiner

SILICON SINGLE CRYSTAL PULLING DEVICE AND GRAPHITE MEMBER USED THEREIN

CROSS REFERENCE TO RELATED APPLICATIONS

This application is based upon and claims the benefits of priority from Japanese Patent Application No. 2006-268028 filed on Sep. 29, 2006, the entire contents of which are incorporated herein by reference.

FIELD OF THE INVENTION

The present invention relates to a silicon single crystal pulling device and a graphite member utilized therein, and a method of preventing the graphite member from deteriorating.

RELATED ART

A mirror wafer used as a substrate in manufacturing a semiconductor device is obtained by slicing a single crystal ingot into a thin plate member and by machining and grounding both top and bottom faces of the wafer. Such single crystal ingot is may be made, for example, by the Czochralski (CZ) method (including MCZ method). A general manufacturing method of the single crystal ingot is described below.

In the Czochralski method, polycrystalline silicon (polycrystalline raw material) as a raw material is loaded in a quartz crucible placed in a furnace of the single crystal pulling device and the quartz crucible is heated by a heater surrounding the quartz crucible such that the polycrystalline silicon is melted and made as raw melt. A single crystal as a seed (seed crystal) is dipped on the top face of the melt and the seed crystal is slowly pulled up by the crystal pulling mechanism such that a single crystal having the same preferred orientation as the seed crystal is grown to be a large cylindrical single crystal ingot. Then, the single crystal ingot as grown in an adequate size is removed from the furnace.

As internal parts constituting the furnace of the crystal pulling device, many graphite members which are stable under a high temperature are generally used and, in addition to the above-mentioned crucible, heater, and the like, an inner shield, a ring for preventing silicon vapor and the like, a lower ring, an upper ring, a receptacle for the crucible, a seed chuck, and the like are constituted of graphite members.

On the other hand, if the graphite member is used as a part in the furnace of the single crystal pulling device, the graphite member tends to be converted into silicon carbide (hereinafter, referred to as SiC) on the surface portion by the reaction with the silicon mono-oxide gas (hereinafter, referred to as SiO gas) generated when the above silicon single crystal is pulled up and with the quartz crucible and the like. If the surface layer is converted into SiC, a shear stress may be generated between the surface layer and the bulk such that the graphite member may be degraded by flaking of the surface layer.

More concretely, in the operation of pulling the silicon single crystal, an SiO gas is generated as silicon melt and quartz of the crucible are reacted with each other in accordance with the formula (A).

$$Si(l) + SiO2(s) \rightarrow 2SiO(g) \qquad (A)$$

Generated SiO gas reacts with a graphite member in the device in accordance with the formula (B) such that the SiO gas is partially converted to SiC and CO gas to dissipate.

$$SiO(g) + 2C(graphite) \rightarrow SiC(s) + CO(g) \qquad (B)$$

In this way, the graphite member is gradually corroded with the SiO gas. Further, SiC formed on the surface of the graphite member causes minute cracks on the surface of the graphite member such that the life time of the graphite member is shortened. Further, since the thermal expansion coefficients of the graphite and SiC are different, the thermal stress caused by the temperature change may lead surface flaking and crack generation and propagation.

In pulling the silicon single crystal doped with volatile dopants (e.g., arsenic, red phosphorus, and antimony), the pressure in the furnace is increased during the crystal growth in order to grow a low electric resistivity single crystal as a target object such that oxide gases such as SiO, SixOy, and AsxOy stay in the furnace for a long period of time so as to cause the reaction with the high purity graphite constituting the furnace member, which may lead to deterioration of the graphite member.

In order to prevent such deterioration of the graphite member, it is known that the graphite member is covered with silicon carbide on the surface to prevent the reaction between the graphite member and the SiO gas (SiC coating method).

For example, some graphite parts for the single crystal pulling device are disclosed in Japanese patent application publication No. 2000-351670. The graphite parts are excellent in the heat resistance so as to endure the drastic temperature increase as well as to prevent cracks and crazes caused by the different thermal expansion of the graphite and SiC. The graphite parts are made of graphite material having specific properties. In Japanese patent application publication No. 2000-319080, a graphite member coated with SiC, which has high stability against the SiO gas even though the thickness of the SiC coating is thin, is disclosed. In the coated graphite member, a mixture layer of graphite and SiC is provided between the graphite body and the SiC coating. For example, it may be the graphite member coated with silicon carbide which can be used suitably as each kind of member of the silicon single crystal pulling device according to the CZ method. Also in Japanese patent application publication No. 2000-290094, a long-life carbon member for the semiconductor single crystal pulling device according to the CZ method is disclosed. The carbon member is made of a composite material such that corrosion with the SiO gas and generation of defects such as cracks because of formation of SiC on the surface are effectively controlled in the silicon single crystal pulling device.

However, cracks and crazes caused by the generated thermal stress cannot be prevented completely although the thermal expansion relaxation layer is provided since the heater and surrounding parts themselves are heated at a high temperature. Further, it is not easy to achieve the crack prevention effect by making the graphite member of a composite material, which is manufactured by impregnating carbon solution and firing the impregnated one. And it is expensive to make the graphite member of such a composite material. For example, when the graphite heater is used for a long time, the surface on the edge part of the top end part is reacted with silicon oxide such that the surface material is degraded and flaking and cracking at the edge part occur because of the thermal stress caused by the different thermal expansion rates of the reacted layer (degraded layer) and non-reacted layer and the repeated heating-and-cooling cycle of the furnace. If fragments caused by the flaking and cracking drop into the silicon melt in the quart crucible, it is a preventive factor to form a single crystal.

Figure 6A:
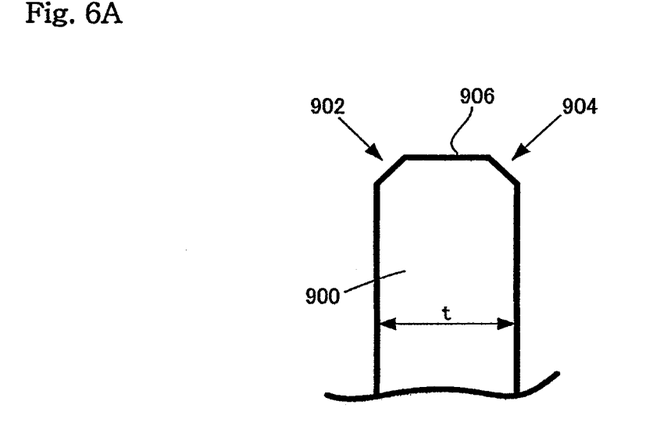
FIG. 6A is a view showing how the heater made of graphite is degraded as flaking and cracking occur in the first stage.
Figure 6B:
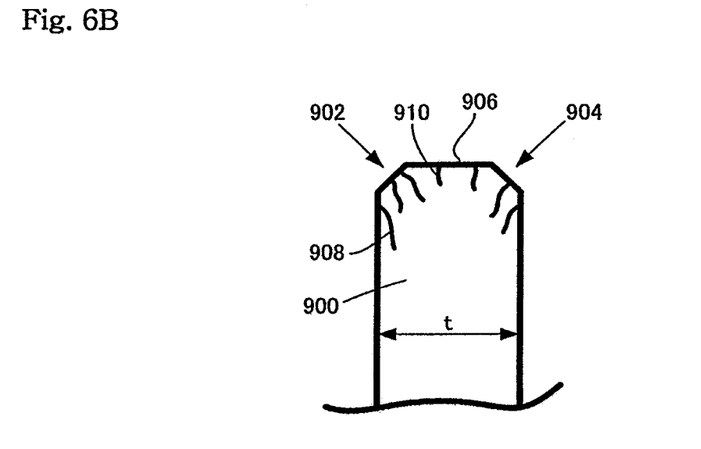
FIG. 6B is a view showing how the heater made of graphite is degraded as flaking and cracking occur in the second stage.
Figure 6C:
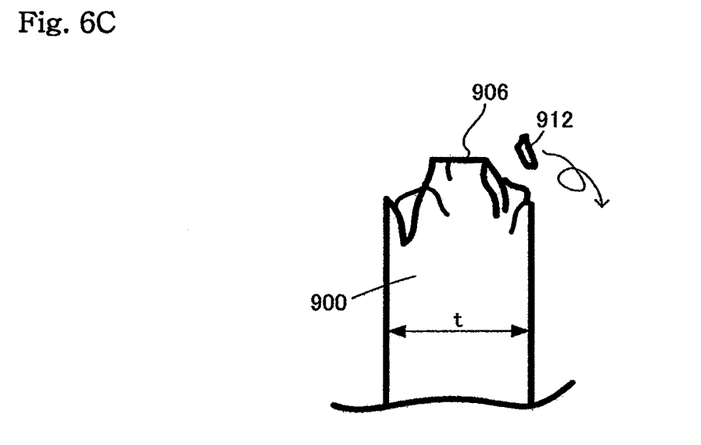
FIG. 6C is a view showing how the heater made of graphite is degraded as flaking and cracking occur in the third stage.

FIG. 6 shows schematically how the graphite member is degraded by the reaction with the SiO gas and the like. FIG. 6A is a partial cross sectional view of a plate part 900 of the graphite member (graphite heater) with the thickness of 't'. The corner parts 902, 904 are cut in a general C1 chamfer. The flat part 906 on the top end, therefore, has a width of 't−1'. Here, the value of 't' is typically from about 15 mm to about 30 mm. FIG. 6B shows how cracks 908, 910 are generated as the graphite member is used and degraded on the surface. Since the degradation is caused by the SiO gas and the like from the surface, the cracks propagate from the surface to the inside. The crack 910 propagates in the vertical direction from the surface. This is because the stress corrosion with the SiO gas and the like occurs at the tip of the crack 910. On the other hand, the crack 908 propagates a little inside from the surface in a parallel direction to the surface. It is plausible that this occurs since the surface layer is flaked because of the shear force by the thermal stress and the like between the surface layer and the bulk body. FIG. 6C shows schematically how the fragment 912 and the like drop after the deterioration of the graphite member progresses and how the plate part 900 of graphite is broken.

After the fragment 912 drops, e.g., into the crucible, the concentration of impurities in the melt is increased. And further, the single crystal may be dislocated if the fragment 912 is attached to the crystal being pulled up. Also, splash of melt caused by dropping of the fragment 912 may be attached to the crystal, which may induce dislocation so as to prevent from obtaining the silicon single crystal and lower the quality of the silicon single crystal.

SUMMARY OF THE INVENTION

In the present invention, the deterioration of the graphite member may be prevented or reduced without changing the material of the graphite member.

As the inventors observed the deterioration of the graphite member, the inventors found the crack generation in the first stage of the deterioration of the graphite member occurred significantly on the so-called edge part (including corner part) and the crack on the corner part further propagated to other portions under other surface. That is, it may be possible to prevent deterioration of the graphite member effectively if the crack generation near the edge parts is controlled.

More concretely, the crack generation near the edge parts can be controlled by rounding off the edge part, but not by chamfering the edge part in a regular way. The edge parts (including corner parts) of the graphite member may be ground to form an R-shape (round or arch shape).

A graphite member utilized in a pulling device for pulling a silicon single crystal is provided. An edge part of the graphite member is rounded off which is exposed to a reactive gas. The graphite member may comprise: a plate part having a thickness of 't' wherein a curvature radius of 'r' satisfies the formula: $t/8 \leq r \leq t/4$.

Further features of the present invention, its nature, and various advantages will be more apparent from the accompanying drawings and the following description of the preferred embodiment.

DESCRIPTION OF THE PREFERRED EMBODIMENT

In the following, a preferred embodiment according to the present invention will be described with reference to the drawings. In the respective drawings, the same reference numeral refers to the component having the same configuration or function and the corresponding part, and description thereof is omitted.

Embodiment 1

Figure 1:
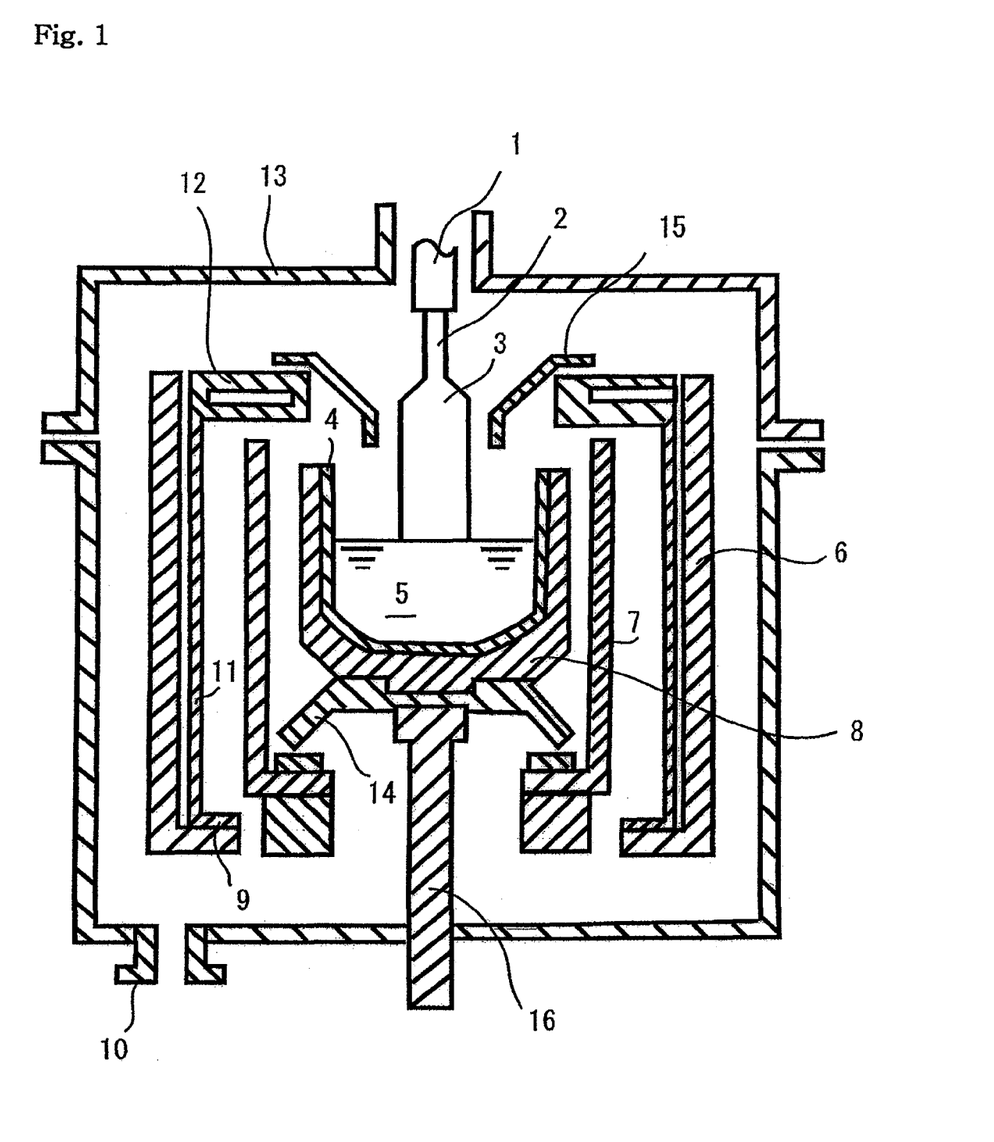
FIG. 1 is a cross sectional view showing schematically a single crystal pulling device in accordance with the CZ method.
Figure 2:
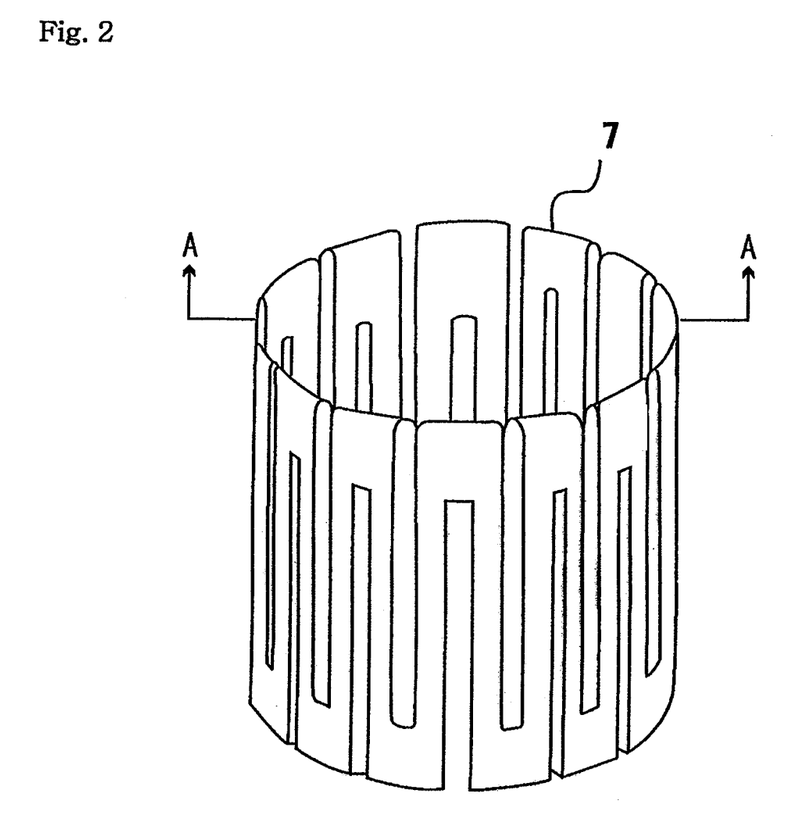
FIG. 2 is a perspective view showing an example of a graphite heater.

FIG. 1 is a cross-sectional view schematically showing a single crystal pulling apparatus in accordance with the CZ method. FIG. 1 shows the single crystal pulling apparatus comprising: a seed chuck 1, a silicon seed crystal 2 held by the seed chuck 1, a silicon single crystal 3 following the silicon seed crystal 2, a quartz crucible 4 which contains raw material of the silicon single crystal 3, a silicon melt 5 which is contained in the quartz crucible 4 and from which the silicon single crystal 3 is pulled, a heat insulating material 6 surrounding these components, a graphite heater 7 which heats the quartz crucible 4, a graphite crucible 8 which covers the quartz crucible 4 and conducts heat from the graphite heater 7, a lower ring 9 which stays on a bottom circular ring portion of the heat insulating material 6, an exhaust port 10 through which internal gas is ventilated, an inner shield 11 provided between the graphite heater 7 and the heat insulating material 6, an upper ring 12 provided over the top edge of the graphite heater 7, a chamber 13 containing these components, a crucible receptacle 14 on which graphite crucible 8 is placed, an upper shield 15 which covers the top face of the silicon melt 5, and a support rod 16 which supports and rotates the crucible receptacle 14. In this apparatus, a purge gas (argon, for example) is caused to flow from the upper part of the silicon single crystal 3 and is led downward to the exhaust port 10 with reactive gases which evaporate from the open surface of the silicon melt 5. FIG. 2 is a perspective view showing an example of the graphite heater 7, and FIG. 3 is an A-A cross-sectional view of the graphite heater 7 as shown in FIG. 2.

Figure 3:
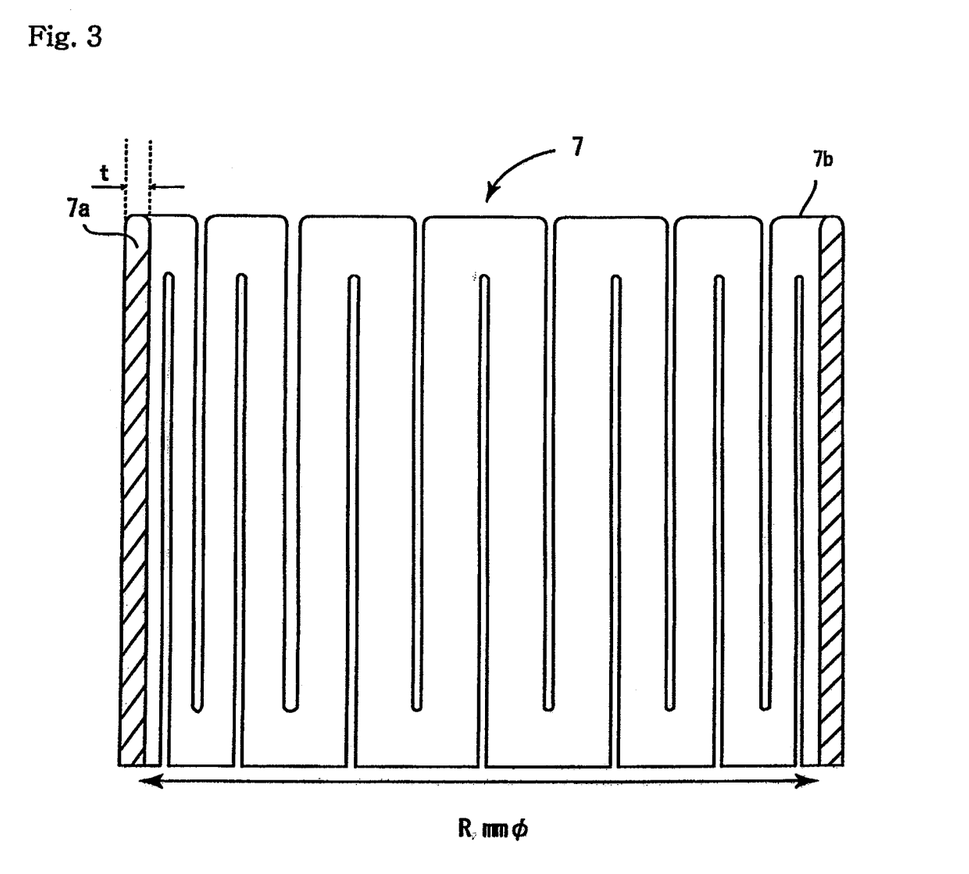
FIG. 3 is a cross sectional view of the graphite heater along the A-A line as shown in FIG. 2.
Figure 4:
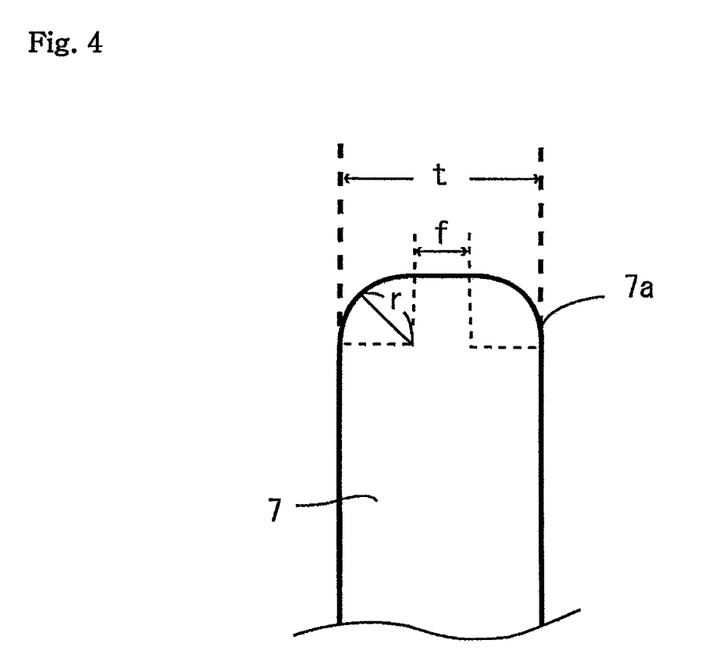
FIG. 4 is a partially expanded view showing an expanded top end part of the graphite heater.

In the cylindrical graphite heater 7 as shown in FIG. 3, a cylindrical part has an inner diameter of R mm, and a plate-like part constituting the heater has a wall thickness of t mm. The cylindrical heater 7 forms an elongated tortuous heater line by alternative cuts from the top edge and the bottom edge. The edge parts (including corner parts) of the top end part 7a of the graphite heater 7 are rounded. FIG. 4 is a partially enlarged view of the top end part 7a of the graphite heater 7. As shown in FIG. 4, the right-angle parts are rounded by grinding so as to impart a predetermined curvature radius 'r'. The value of 'r' will be mentioned later. Further, as shown in FIG. 4, the top end part 7a has a flat surface of a width of 'f'.

If a relationship of 't/2<r' is satisfied between the curvature radius 'r' and thickness 't', this flat surface does not exist any more in the top end part 7a such the top face may comprise a ridge part having a pointing shape, which is not necessarily preferable. The relative surface area to the bulk volume of the ridge part having the pointing shape tends to be large such that such part is easily deteriorated by a reactive gas (for example, SiO). Therefore, it is preferable that at least the thickness 't' is equal to or larger than '2r'. If the relation of 't=2r' is satisfied, the top end is round.

Since the inner diameter of the cylindrical graphite heater 7 in Embodiment 1 is larger than the external shape of the crucible which the heater surrounds, the magnitude of 'R' is about 300 mm to about 1000 mm, but may have suitable magnitude according to the size of a silicon single crystal to be manufactured. Since a silicon single crystal having a larger diameter is increasingly desired, it is desired that the magnitude of 'R' becomes even larger. The wall thickness 't' of the graphite member in a cylindrical shell shape which constitutes the graphite heater 7 may be selected from 5 mm to 40 mm in consideration of the heat generation characteristics and mechanical strength thereof. And more specifically, the wall thickness 't' of the graphite member may be selected in a range of 15 mm to 30 mm. Therefore, the curvature radius 'r' of the rounded part is selected to be equal to or larger than 't/8' and more preferably equal to or larger than 't/7', and equal to or smaller than 't/4' and more preferably equal to or smaller than 't/5'. It should be understood that the wall thickness 't' is determined in accordance with the mechanical strength and desired heat generation characteristics and the most desirable curvature radius for the wall thickness 't' is suitably selected in the above-mentioned range.

In the conventional heater, on the side end part 7b of the top end part of the graphite heater 7, there is a corner part where three surfaces meet. In the present invention, the corner part is ground to have a sphere curvature radius 'rb'. If the corner part is ground in such a way, no sharp edge part is provided such that it is not likely that the graphite heater 7 is deteriorated. It is preferred that the surface of each rounded part has a predetermined surface roughness (below 5 μm in terms of Ra) since the surface tends to be deteriorated easily from a convex-concave part thereof if the surface roughness is too large.

Thus, it is possible to effectively prevent the reactive gas from deteriorating the graphite heater 7 by rounding off the edge parts of the graphite heater 7 (i.e., the edge parts are machined to form a round corner having a curvature radius of R) even though the surface is not silicified to form SiC. The reason therefor is not necessarily clear, but it is inferred that the reaction for the deterioration on the surface is slowed or prevented from progressing further by reducing the surface contact with the reactive gas and the residual stress caused by machining at the edge part.

It is a usual practice to raise pressure inside a furnace to suppress evaporation of an N-type dopant (volatile) added to the melt of polycrystalline silicon. However, when the pressure is raised, reactive gases which have evaporated into the environment inside the furnace (for example, $As_xO_y$, $Sb_xO_y$) stay there for a long period of time. Since the graphite heater 7 is arranged in a path in which the reactive gases flow, the reactive gases tend to react with the graphite heater 7 made of carbon and degrade such graphite member.

Embodiment 2

Figure 5:
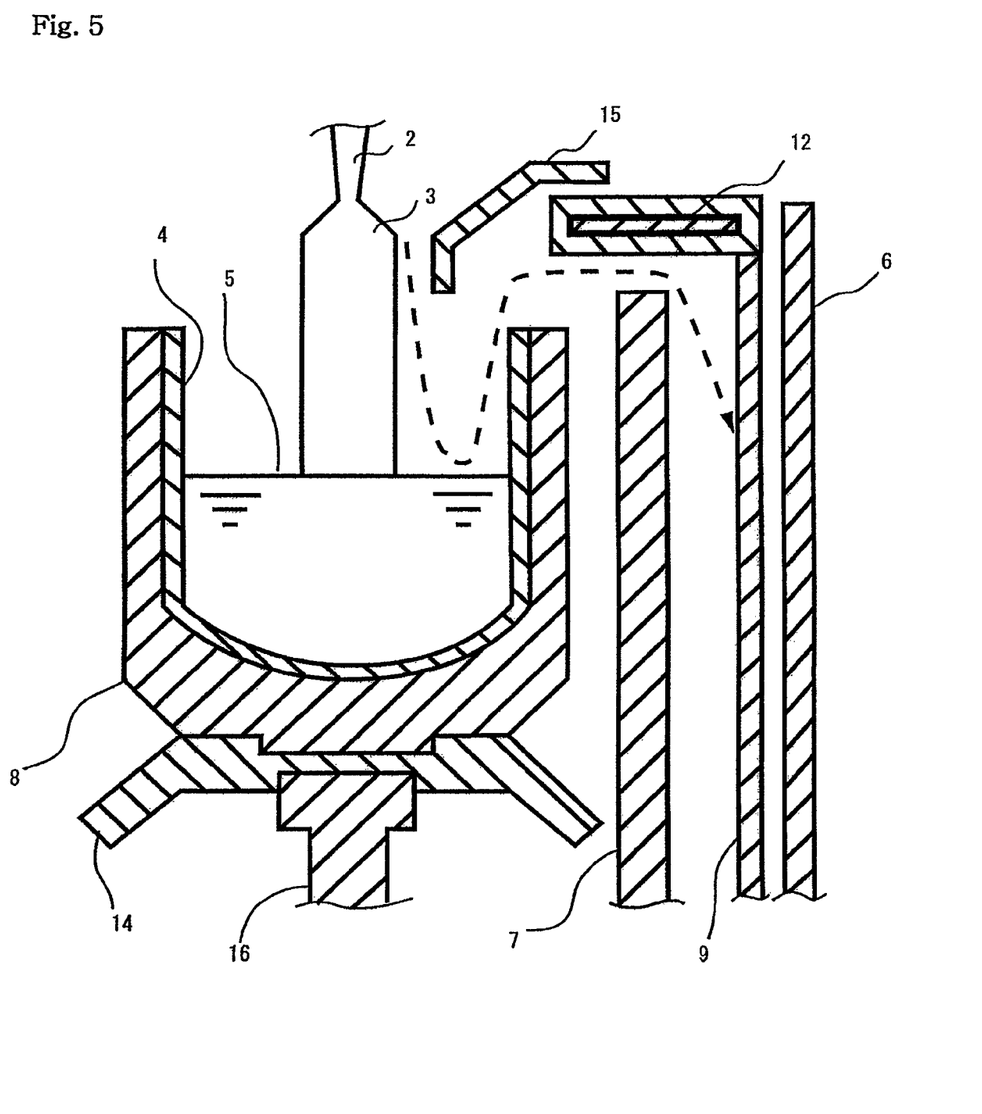
FIG. 5 shows an example of flow paths of reactive gases flowing in the furnace.

In Embodiment 1, the embodiment is described with respect to the graphite heater. In this embodiment, the explanation thereof is made with respect to other components than the graphite heater 7 which are arranged in the furnace of the single crystal pulling apparatus. Here, the other components comprise a graphite member. The configuration of the single crystal pulling apparatus is shown in FIG. 1. FIG. 5 shows an example of the flow paths of the reactive gases flowing inside the furnace. In FIG. 5, the main flow path of the gas in the furnace is indicated by the dotted line with a pointing at the leading edge. FIG. 5 shows an enlarged view of the single crystal pulling apparatus of FIG. 1. The reactive gases which are mainly generated from the melt 5 in a crucible 8 flow over the rim of the graphite crucible 8 along the main path of the gas, passes over the top end part of a graphite heater 7, and then descends along the inner side surface of the cylindrical inner shield 11. Although edge parts (including corner parts) exist at lower part of the graphite heater 7, it is not necessary to round off such edge parts since these parts are not arranged in the flow path of the reactive gases. However, it is more preferable to round off the edge parts since the flow path may change unexpectedly.

Since the rim of the graphite crucible 8 which comprises a graphite member is disposed in the flow path of the reactive gases, the graphite member is also deteriorated in a similar manner as the graphite heater 7. Therefore, it is preferred to round off the rim (top end of the crucible) of the graphite crucible 8.

Since a number of components comprising: graphite members are disposed inside the furnace, it is concerned that the graphite components may be degraded in the path of the reactive gases which flow inside the furnace. It is possible to prevent the components from deteriorating so as to reduce the obstruction in producing the single crystal pulling by rounding off the edge parts of such members. For example, the lower ring 9 arranged at the lower part of the inner shield 11 is not in thermal conditions as severe as those of the heater, but is exposed to the reactive gases. Hence, it is preferable to round off the edge parts of the lower ring 9.

Besides the graphite heater 7, the graphite crucible 8, and inner shield 11 mentioned above, graphite members are used in the seed chuck 1, the lower ring 9, the inner shield 11, the upper ring 12, the crucible receptacle 14, and the like such that the deterioration of each component by the reactive gases can be prevented by rounding off the edge parts (including corner parts). Although the above description of the flow path of the reactive gases is made mainly for the path of the purge gas, it is needless to say that the reactive gases flow also by convection. For example, an atmospheric gas may be swirled up with the heat of the heater, and the reactive gases may similarly be swirled up along the flow of the atmospheric gas. The gas which has been swirled up in this way may form a descending flow at the low temperature part, and the like, of the apparatus. Since the gas flows less smoothly in a situation where a gas flow rate is low, the reactive gases may stay for a long period of time and react with the graphite heater and other graphite members so as to cause the graphite member deterioration. This effect is promoted when high pressure conditions inside the furnace of 100 torr or more are employed. It is not necessarily easy to determine the flow path. Therefore, if the edge part (including corner part) of each member is rounded off in advance, deterioration which may be caused by the reactive gases can be suppressed even when the flow path of the reactive gases changes.

Since the deterioration of the graphite heater and other components is prevented in the above way, the frequency of component replacement is decreased, and contamination and adverse effects on products by fragments thereof are reduced.

Therefore, it is possible to achieve stable crystal growth in the single crystal pulling apparatus.

EXAMPLE

Silicon single crystal pulling was repeated using the graphite heater 7, the top end part 7a of which was rounded off with the curvature radius 'r' of 4 mm and the width 't' of which was set to 20 mm, and it was investigated when a crack was detected and a fragment was generated at the top end part 7a, i.e., how many times the pulling operations had been made before when such phenomena occurred. Since the crack generation may be affected by the conditions of pulling the silicon single crystal, a comparative example was provided under the same conditions of pulling the silicon single crystal. Here, the graphite heater had the top end part which was C2-chamfered. The crack generation was inspected by visually observing the external appearance of the graphite heater. Table 1 summarizes the inspection results.

TABLE 1

| Appearance checking items | C2-chamfer (comparative) | R-shape (example) |
| --- | --- | --- |
| Cracks or crazes | 1.0 | more than 2.67 |
| Fragments | 1.2 | more than 3.33 |

*The above values are normalized by the number of repetitions of pulling until the cracks or crazes occurred in C2-chamfer.

The life time of the graphite heater of the example was 2.6 times longer than that of the comparative example in the cracks or crazes. On the other hand, the life time of the graphite heater of the example was 2.7 times longer than that of the comparative example in the fragments. The term "more than" means the cracks or crazes, or the fragments were not detected in the experiment.

According to the above-mentioned results, it is clear that the graphite heater having the rounded edge parts was remarkably slower in the deterioration rate if compared to that of the heater having the C-chamfered edge parts. Therefore, the effects of rounding the edge parts are clearly shown.

In consideration of the aforementioned explanation, the following example may also be included according to the present invention.

More specifically, the following is provided.
(1) A graphite member utilized in a pulling device for pulling a silicon single crystal is provided. An edge part of the graphite member, which is exposed to a reactive gas, is rounded off.

In the above mentioned graphite member, the process for rounding off the corner may be conducted by a general machining and grounding. For example, a curvature face is made on a whetstone for grounding in advance and the corner is grounded by the whetstone to form a round face.
(2) The graphite member utilized in the pulling device according to the above (1) comprising: a plate part having a thickness of 't' is provided. The, a curvature radius of 'r' satisfies the formula: $t/8 \leq r \leq t/4$.

Here, the curvature radius 'r' may be substantially constant over the entire rounded part, but it is also possible to vary the curvature radius 'r' on different portions over the rounded part. In such a case, the minimum value of the curvature radius 'r' may be utilized to judge whether the above mentioned relation is satisfied or not.
(3) The graphite member utilized in the pulling device according to the above (1) or (2) is characterized in that the reactive gas comprises silicon oxide.
(4) The graphite member utilized in the pulling device according to any one from (1) to (3) is characterized in that the graphite member constitutes a graphite heater.
(5) A silicon single crystal pulling device comprising: a graphite member as described any one from (1) to (4) is provided. An edge part of the graphite member, which is exposed to a reactive gas, is rounded off.
(6) A method of preventing deterioration of a graphite member utilized in a silicon single crystal pulling device comprising the step of: making an edge part of a plate part having a thickness of 't' included in the graphite member which is exposed to a reactive gas is provided. It is characterized in that a curvature radius 'r' satisfies a formula: $t/8 \leq r \leq t/4$.

Here, many graphite members are utilized in the silicon single crystal pulling device due to the high heat resistance and the corrosion resistance so as to control generation of contamination. However, it is desired to apply a preventive method against the deterioration since even such a graphite member may be degraded depending on the corrosive conditions. Therefore, it is desired firstly to specify a portion of the graphite member that is exposed to the reactive gas. This is because it is not advantageous to make all the corners rounded off with a prescribed round shape (R-shape) if the productivity of making the graphite member and the cost thereof are considered. In the silicon single crystal pulling device, the reactive gas is typically generated from the silicon melt melted in the crucible. On the other hand, in order to clean up the ambient atmosphere in the device and assure the stability of the composition and the pressure of the ambient gas, it is conducted that a prescribed amount of flow of the purge gas is introduced in the device and the purge gas and the device comprises an exhaust opening for exhausting the purge gas and the reactive gas. In this exhaust opening, the pressure is reduced by a pump or the like compared to the ambient atmosphere such that the reactive gas generated from the silicon melt is directed and discharged from the exhaust opening. As for the flow path of the reactive gas, it is also possible to infer the flow path based on the experience, and it is possible to investigate the flow path by the experimental visualization of the flow path, and it is also possible to infer the flow path by the numerical calculation. In the step of specifying the parts which are exposed, one or more of the above mentioned methods may be applied independently or cooperatively. Also, in order to make the R-shape, the corner parts in a rectangle shape may be first made and processed into a round shape (R-shape). And the R-shape machining may be made when the parts are processed.

In the furnace of the silicon single crystal pulling device, SiO gas and the like are generated in the crucible and the like in which silicon is melt and an exhaust opening through which an internal gas of the furnace is discharged is installed in order to prevent a harmful gas from staying inside. Thus, the flow path for the SiO gas and the like to the exhaust opening is made. Graphite members provided in this flow path are more likely to be degraded by the SiO gas and the like than graphite members disposed in another place.

In particular, graphite members disposed near the heater to heat the crucible or near the member such as crucible in which SiO gas and the like are generated tend to be heated to a high temperature and the degradation progress speed becomes faster. Therefore, it is preferable to round off the corner parts of such members.

Here, the deterioration reaction of the graphite may be considered and the following reactions may be inferred.

It is understood that the graphite is degraded by the reactive gas in the above formulae (C), (D), (E), and (F). It is also understood whether the reaction is ready to occur or not at the prescribed conditions (temperature and atmosphere) if the Gibbs free energy is considered. In the present invention, specific parts of the graphite member are changed in the shape in order to suppress these reactions. This is to reduce the surface of the graphite in the above-mentioned formulae and corresponds to the concentration adjustment.

In the present invention, it is possible to prevent the graphite member from deteriorating by rounding off the corner portions of the graphite member. Therefore, it is possible to make a stable crystal growth with the single crystal pulling device by applying this.

What is claimed is:

1. A graphite heater embodied in a pulling device configured to pull a silicon single crystal comprising a plate part which generates heat wherein both edge parts of a top part of the plate part are rounded off, the plate part heats a crucible disposed separately from and surrounded by the heater, raw silicon melt is melted in the crucible, the plate part has a thickness of 't', and a curvature radius of 'r' of each rounded edge part satisfies the formula: $t/8 \leq r \leq t/4$.

2. The graphite heater embodied in the pulling device according to claim 1 wherein the graphite heater is exposed to a reactive gas comprising silicon oxide.

3. The graphite heater embodied in the pulling device according to claim 1 wherein the graphite heater comprises a corner part at the top part of the plate part and the corner part is ground to have a sphere curvature radius.

4. The graphite heater embodied in the pulling device according to claim 1 wherein the top part of the plate part has a surface roughness of less than 5 μm Ra.

5. The graphite heater embodied in the pulling device according to claim 3 wherein the top part of the plate part has a surface roughness of less than 5 μm Ra.

6. The graphite heater embodied in the pulling device according to claim 1 wherein the graphite heater is disposed in a furnace of the pulling device.

7. The graphite heater embodied in the pulling device according to claim 1 wherein the graphite heater is shaped in a cylindrical shape with alternative cuts from a top edge and a bottom edge.

8. The graphite heater embodied in the pulling device according to claim 7 wherein the graphite heater comprises an elongated tortuous heater line.

* * * * *